United States Patent
Rao et al.

(10) Patent No.: US 7,479,429 B2
(45) Date of Patent: Jan. 20, 2009

(54) SPLIT GAME MEMORY CELL METHOD

(75) Inventors: Rajesh Rao, Austin, TX (US);
Ramachandran Muralidhar, Austin, TX (US); Leo Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 177 days.

(21) Appl. No.: 11/669,307

(22) Filed: Jan. 31, 2007

(65) Prior Publication Data

US 2008/0182375 A1 Jul. 31, 2008

(51) Int. Cl.
*H01L 21/336* (2006.01)

(52) U.S. Cl. .............. 438/261; 438/288; 257/E21.679

(58) Field of Classification Search ............. 438/261, 438/288; 257/E21.18, E21.21, E21.423, 257/E21.679, E29.309
See application file for complete search history.

(56) References Cited

U.S. PATENT DOCUMENTS

| | | | |
|---|---|---|---|
| 6,673,677 B2 * | 1/2004 | Hofmann et al. | ............ 438/257 |
| 6,706,599 B1 | 3/2004 | Sadd et al. | |
| 6,897,517 B2 | 5/2005 | Van Houdt et al. | |
| 7,368,347 B2 * | 5/2008 | Joshi et al. | ................... 438/257 |
| 7,378,314 B2 * | 5/2008 | Hong et al. | ................. 438/257 |

* cited by examiner

*Primary Examiner*—M. Wilczewski
*Assistant Examiner*—Toniae M. Thomas
(74) *Attorney, Agent, or Firm*—Daniel D. Hill; James L. Clingan, Jr.

(57) ABSTRACT

A multi-bit split-gate memory device is formed over a substrate. A storage layer is formed over the substrate. A first conductive layer is formed over the storage layer. A thickness of a portion of the conductive layer is removed to leave a pillar of the conductive layer and an area of reduced thickness of the conductive layer. A first sidewall spacer is formed adjacent to the pillar to cover a first portion and a second portion of the area of reduced thickness of the conductive layer. The pillar is replaced with a select gate. The area of reduced thickness is selectively removed to leave the first and second portions as control gates.

20 Claims, 7 Drawing Sheets

SPLIT GAME MEMORY CELL METHOD

FIELD OF THE INVENTION

The present invention relates generally to semiconductor devices, and more particularly, to a method for making a multi-bit split-gate non-volatile memory device.

RELATED ART

One type of non-volatile memory uses electron or hole "traps" in an insulating layer for charge storage. One material used in such a manner is silicon nitride. Typically, the nitride charge storage layer is surrounded by other insulating layers such as oxide forming an oxide-nitride-oxide (ONO) structure. Charge stored within the nitride is used to manipulate a threshold voltage of the transistor, and in this manner store data. A conventional non-volatile memory cell typically stores a bit in one of two states representing either a logical zero or a logical one. To increase the capacity of a memory device without significantly increasing the size of the memory, a multi-bit memory cell may be used that is capable of storing more than one bit in the cell. Non-volatile memory cells of this type, referred to herein as multi-bit memory cells, have historically been implemented by controlling the location of charge that is injected into portions of the nitride charge storage layer. For example, charge may be stored near the source and drain region of a MOSFET (metal-oxide semiconductor field-effect transistor), each location storing one bit of information associated with an absence or presence of local charge.

The reliability of multi-bit memory cells that rely on localization of charge is susceptible to charge migration that delocalizes the stored charge. More specifically, the charge may migrate through the nitride layer, especially at elevated temperatures by Poole-Frenkel mechanism, causing the stored logic states to change. To solve the problem of charge migration, multiple independent and electrically isolated floating gates have been used. However, it has been necessary to use multiple masking steps to fabricate the multiple floating gates, significantly increasing the cost of the device due to the increased process complexity.

Therefore, there is a need for a multi-bit non-volatile memory device that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
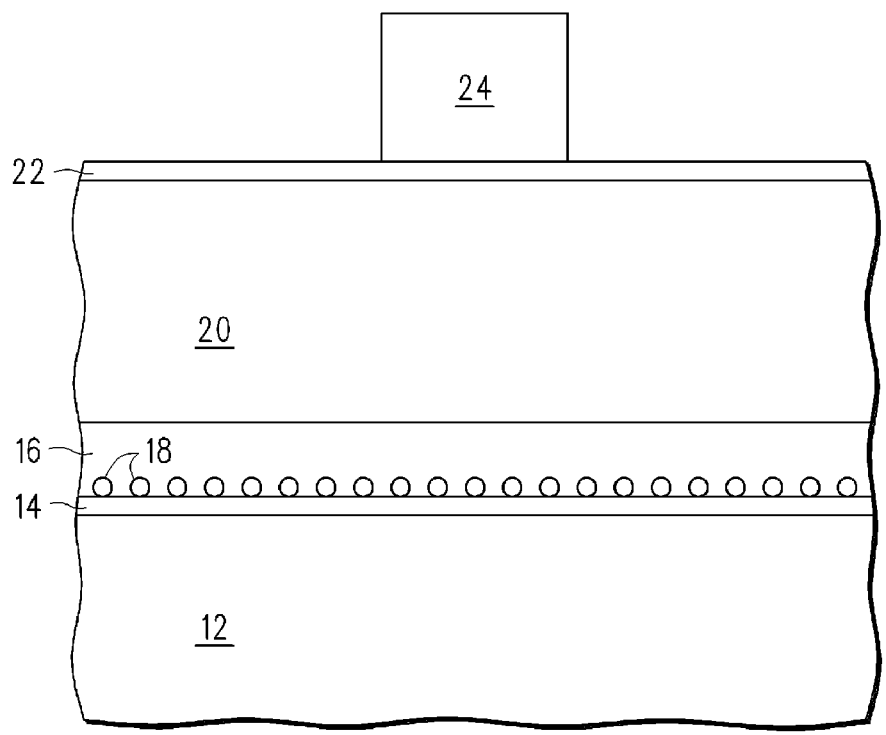
FIG. 1-FIG. 13 illustrate, in cross-sectional views, a method for forming a multi-bit split-gate non-volatile memory device in accordance with an embodiment of the present invention.

Generally, the present invention provides a method for forming a multi-bit split-gate non-volatile memory device that requires only one masking step to manufacture, thus reducing manufacturing complexity and cost. In one aspect of the present invention, a multi-bit split-gate memory device is formed over a substrate. Generally, in one aspect, the method begins with forming a storage layer over the substrate. Then, a first conductive layer is formed over the storage layer. A thickness of a portion of the conductive layer is removed to leave a pillar of the conductive layer and an area of reduced thickness of the conductive layer. A first sidewall spacer is formed adjacent to the pillar to cover a first portion and a second portion of the area of reduced thickness of the conductive layer. The pillar is replaced with a select gate. The area of reduced thickness is selectively removed to leave the first and second portions as control gates.

In another aspect, a method for forming a split-gate memory cell using a semiconductor substrate comprises: forming a storage layer over the substrate; forming a first polysilicon layer having a thickness over the storage layer; forming a nitride layer over the polysilicon layer; forming a masking layer having a pattern over the nitride layer; etching through the nitride layer according to the pattern; etching a portion of the polysilicon layer according to the pattern to leave a pillar of polysilicon under the masking layer and an area of reduced thickness of polysilicon surrounding the pillar; forming a first nitride sidewall spacer around the pillar to cover a portion of the area of reduced thickness and leaving an exposed portion of the area of reduced thickness; growing polysilicon over the exposed portion of the area of reduced thickness to form an area of enhanced thickness of polysilicon; oxidizing a top portion of the area of enhanced thickness of polysilicon to form a top oxide layer; removing the pillar to form an opening; replacing the first nitride sidewall spacer with a second nitride sidewall spacer; depositing a second polysilicon layer in the opening, over the second nitride sidewall spacer, and over the top oxide layer; etching back the second polysilicon layer to leave a polysilicon portion in the opening; removing the top oxide layer; while using the second nitride sidewall spacer as a mask, removing the area of enhanced thickness of polysilicon and the charge storage layer to leave a polysilicon remnant under the second sidewall spacer; and forming source/drains in the substrate spaced from the polysilicon portion in the opening.

In yet another aspect, a method for forming a split-gate memory cell using a semiconductor substrate, comprises: forming a storage layer over the substrate; forming a first conductive layer over the storage layer; reducing a thickness of a portion of the conductive layer to leave a pillar of the conductive layer and an area of reduced thickness of the conductive layer; forming a first sidewall spacer adjacent to the pillar to cover a first portion and a second portion of the area of reduced thickness of the conductive layer; forming an insulating layer over the area of reduced thickness; while using the insulating layer as a mask, replacing the pillar with a select gate; removing the insulating layer; and selectively removing the area of reduced thickness to leave the first and second portions as control gates.

The semiconductor substrate described herein can be any semiconductor material or combinations of materials, such as gallium arsenide, silicon germanium, silicon-on-insulator (SOI), silicon, monocrystalline silicon, the like, and combinations of the above.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

FIG. 1 illustrates a cross-sectional view of a structure on a substrate 12 of a semiconductor device 10. A conventional gate stack for a non-volatile device is formed over substrate 12 and includes insulating layer 14 and charge storage layer 16. In the illustrated embodiment, insulating layer 14 is grown from substrate 12. Charge storage layer 16 includes a plurality of discrete charge storage elements embedded in one or more insulating layers. In the illustrated embodiment, nanocrystals 18, represented by the small circles in charge storage layer 16, are used to form the plurality of discrete charge storage elements. These nanocrystals are typically formed of silicon, but the discrete storage elements may also be formed of clusters of material consisting of, for example, of germanium, silicon carbide, any number of metals, or in any combination. Typically, the charge storage material consists of nitride, although any number of dielectrics containing traps may be used, such as aluminum oxide, zirconium oxide, hafnium oxide, tantalum oxide, lanthanum oxide, hafnium silicate, or hafnium aluminate. In another embodiment, charge storage layer 16 may be formed from a different material, such as for example, a floating gate formed from polysilicon.

A conductive layer 20 formed from polysilicon is formed over the charge storage layer 16. In one embodiment, polysilicon layer 20 is deposited to have a thickness of about 1000 Angstroms. A nitride layer 22 is formed over the polysilicon layer 20. The polysilicon layer 20 is doped using ion implantation. A photo resist layer is then formed over polysilicon layer 20. The photo resist layer is patterned to form a patterned photo resist layer 24. Note that patterning photo resist layer 24 is the only step of the herein described method requiring the use of a photomask.

Figure 2:
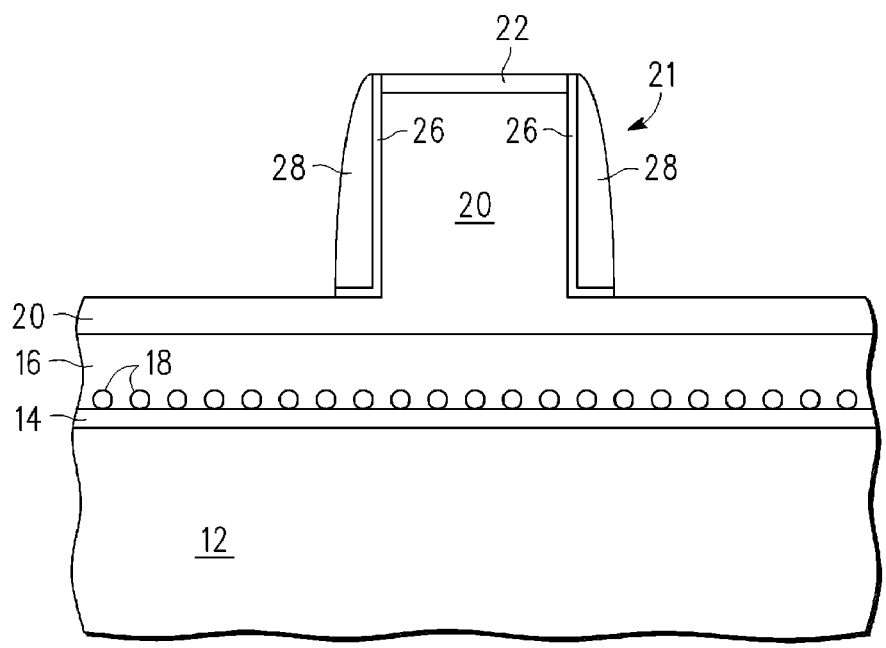

FIG. 2 illustrates a cross-sectional view of non-volatile memory device 10 after polysilicon layer 20 and nitride layer 22 are etched in the areas not covered by patterned photo resist layer 24. A pillar or fin shaped structure 21 is thereby formed. As can be seen in FIG. 2, not all of polysilicon layer 20 is removed from the uncovered areas. In one embodiment, the etch process is stopped when polysilicon layer 20 has a reduced thickness of about 200 Angstroms in the areas not covered by photo resist layer 24. The patterned photo resist layer 24 is then removed. An oxide liner 26 is formed on the structure 21 and sidewall spacers 28 are formed on the oxide liner 26 adjacent to and on opposite sides of structure 21. The spacer material is typically nitride, although it may be formed of another material that can be selectively etched. The sidewall spacers cover a first portion and a second portion of the area of reduced thickness of polysilicon layer 20. The first and second portions provide the control gates for the memory cell 10 as will be described below.

Figure 3:
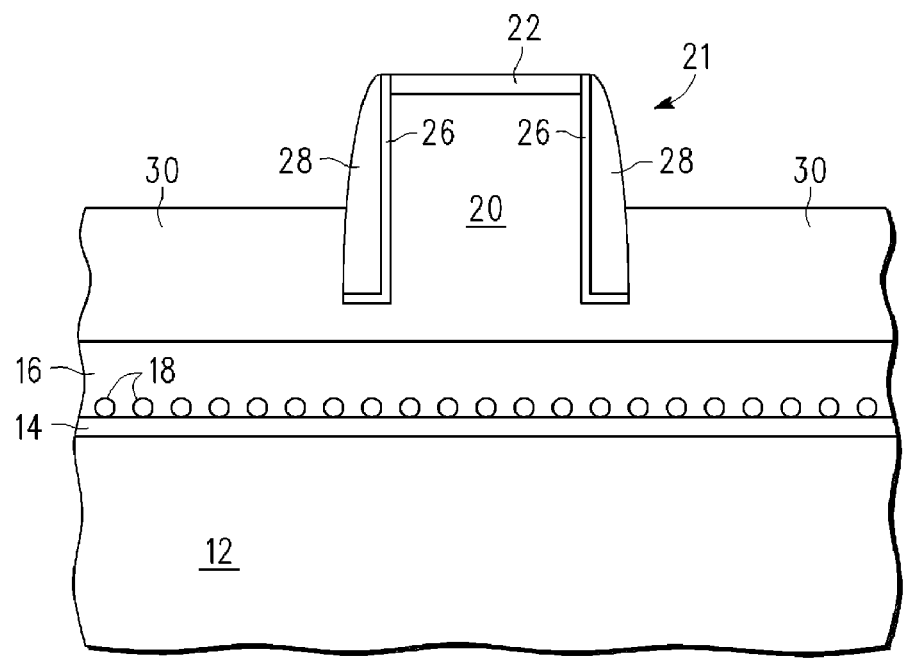

FIG. 3 illustrates a cross-sectional view of the non-volatile memory device 10 after polysilicon layer 30 is formed. Polysilicon is epitaxially grown on etched polysilicon layer 20 to produce the polysilicon layer 30 having an enhanced thickness of about 500 Angstroms.

Figure 4:
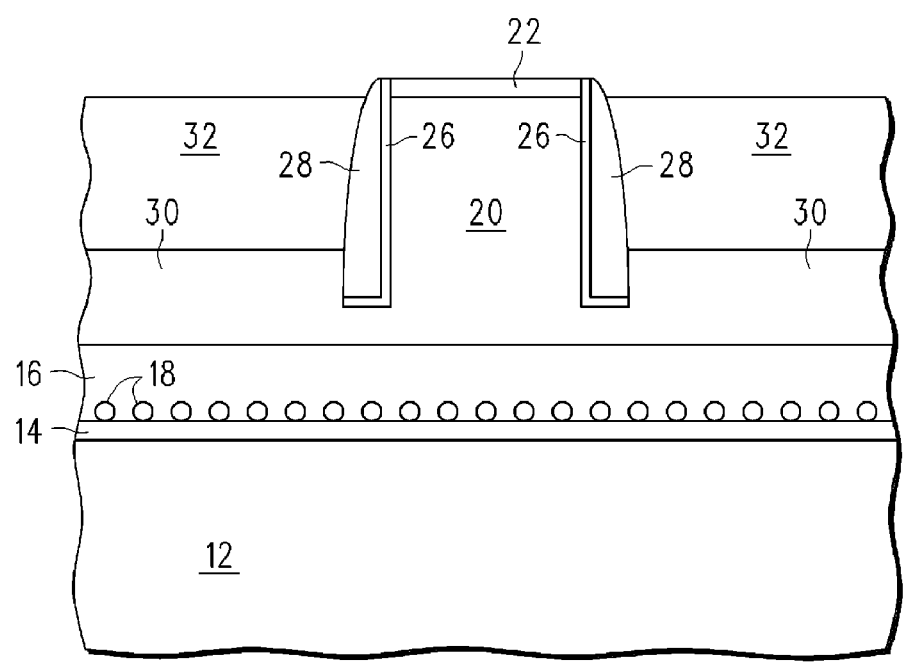

FIG. 4 illustrates a cross-sectional view of the multi-bit non-volatile memory device after oxide layer 32 is grown on polysilicon layer 30. Oxide layer 32 is grown to have a thickness of about 300 Angstroms. Note that, as illustrated in FIG. 4, the thickness of polysilicon layer 30 is reduced slightly when oxidized.

Figure 5:
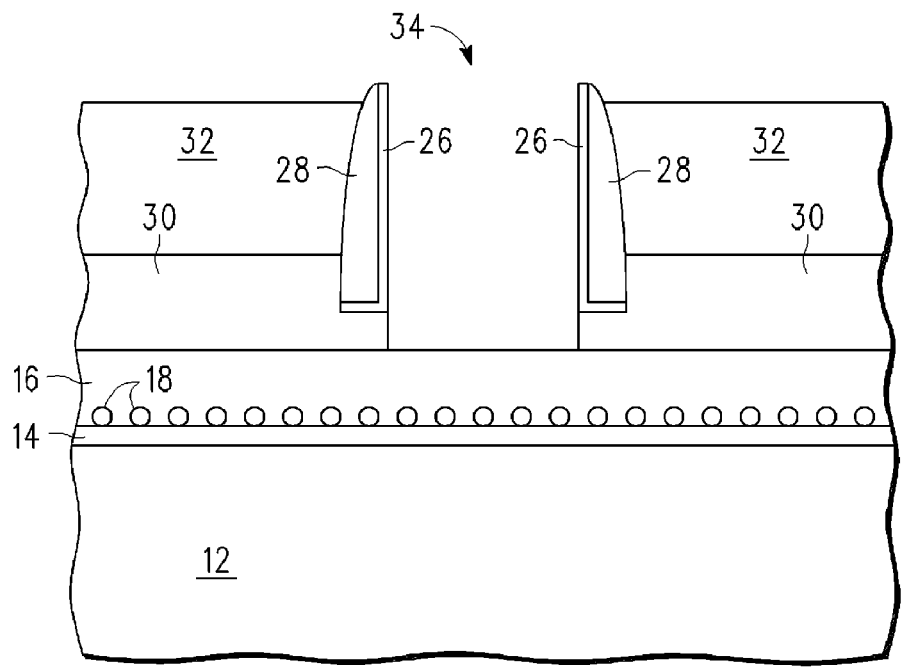

FIG. 5 illustrates a cross-sectional view of non-volatile memory device 10 after nitride layer 22 and structure 21 are removed to form opening 34. The nitride layer 22 and structure 21 are both removed using conventional nitride strip and polysilicon etch processes.

Figure 6:
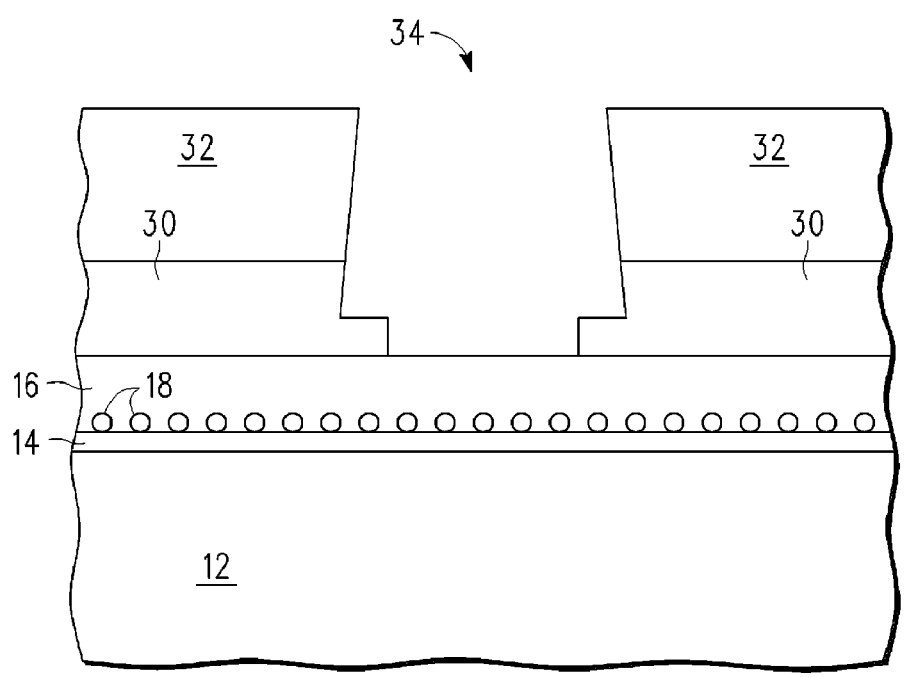

FIG. 6 illustrates a cross-sectional view of non-volatile memory device 10 after sidewall spacers 28 and oxide liners 26 are removed using conventional wet etch chemistries such as for example, the application of hot phosphoric acid to remove sidewall spacers 28 and diluted HF to remove oxide liners 26. The first and second portions covered by sidewall spacers, as discussed above, are re-exposed. Note that, as the oxide liners 26 are very thin; only a small portion of the oxide layer 32 is removed during the wet etch of oxide liners 26.

Figure 7:
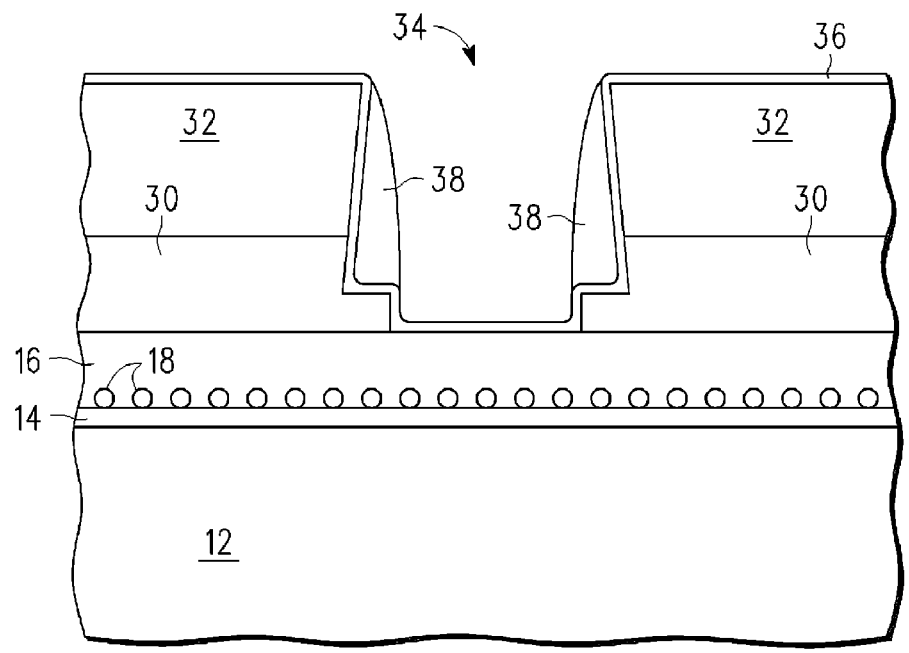

FIG. 7 illustrates a cross-sectional view of non-volatile memory device 10 after a dielectric material is deposited to form insulating layer 36 on insulating layer 32 and within opening 34. Nitride sidewall spacers 38 are formed on the insulating layer 36 within opening 34. The insulating layer 36 will provide electrical isolation between the two control gates and one select gate.

Figure 8:
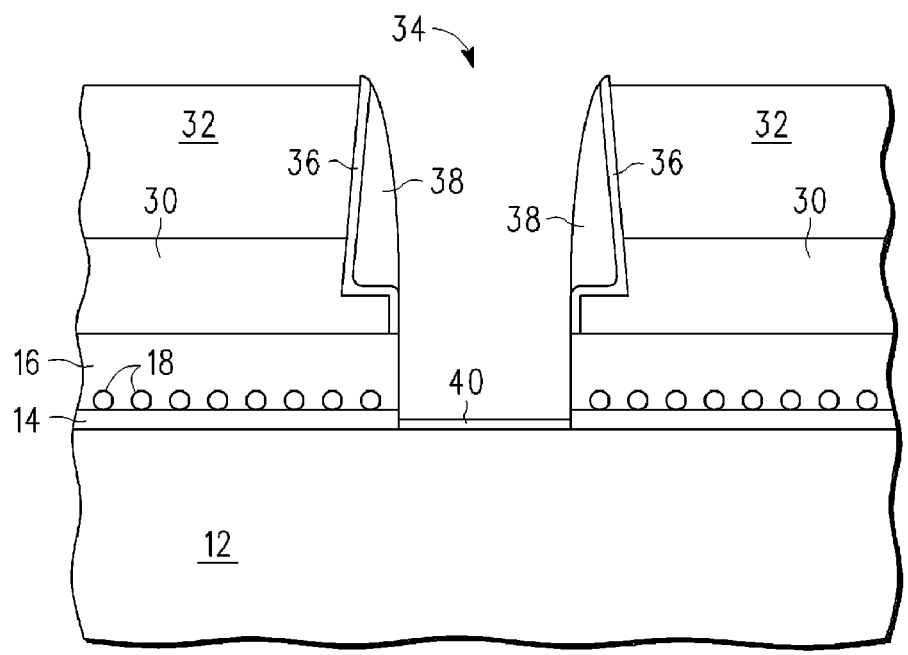

FIG. 8 illustrates a cross-sectional view of non-volatile memory device 10 after insulating layer 36 and the gate stack are removed using an anisotropic dry chemical etch process. During the etch process, a portion of insulating layer 32 is removed. Sidewall spacers 38 function as self-aligned masks when the gate stack material is removed when etching within opening 34. A gate dielectric material is grown in the bottom of opening 34 to form a gate dielectric layer 40. The layer 40 is the select gate dielectric and is typically less than about 100 A.

Figure 9:
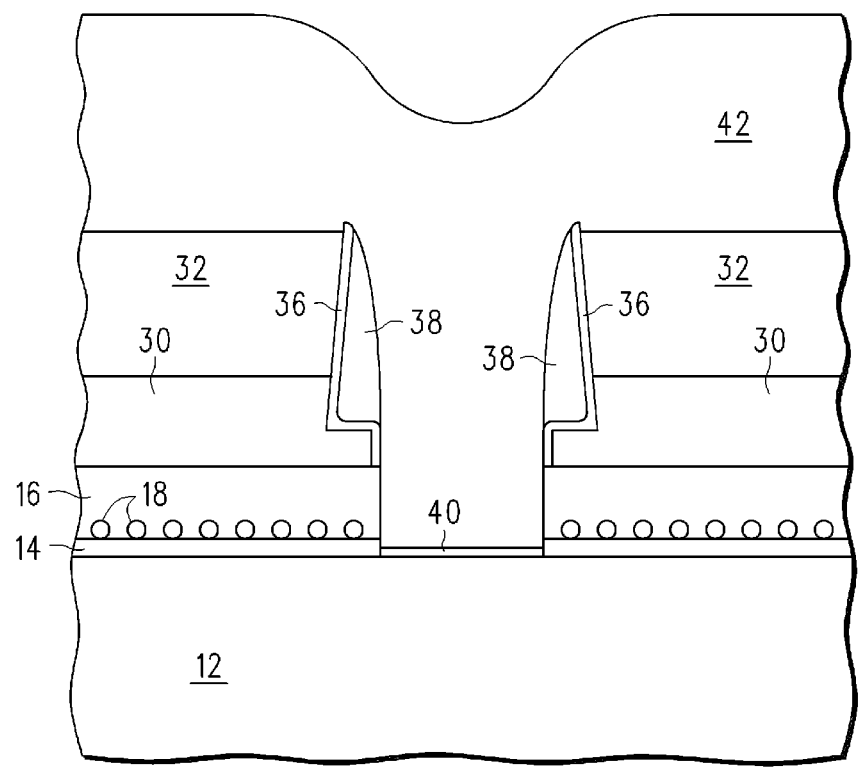

FIG. 9 illustrates a cross-sectional view of non-volatile memory device 10 after depositing a gate polysilicon layer 42 on insulating layer 32 and within opening 34. The gate polysilicon layer 42 is doped using ion implantation and functions as a select gate for the multi-bit non-volatile memory cell. The gate dielectric layer 40 functions as the gate dielectric for the select gate 42 of the memory cell 10.

Figure 10:
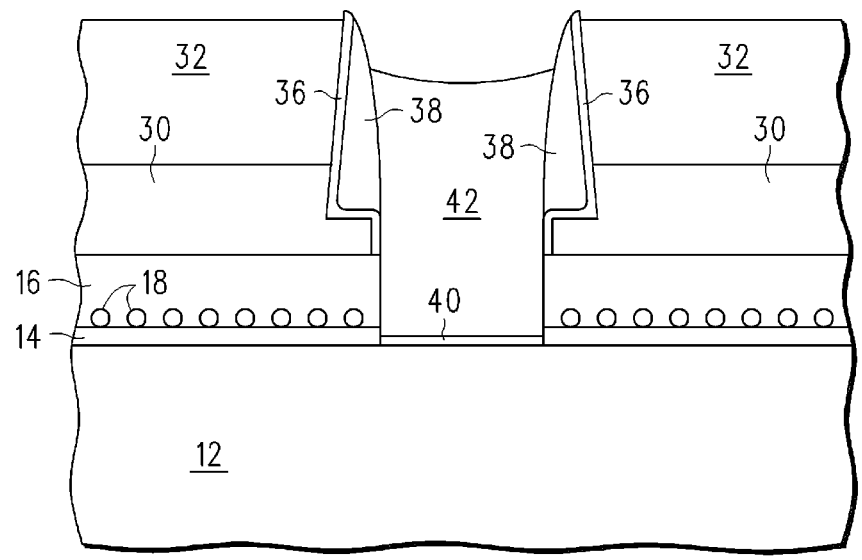

FIG. 10 illustrates a cross-sectional view of non-volatile memory device 10 after a portion of the gate polysilicon layer 42 not within opening 34 is removed. In the illustrated embodiment, the remaining portion of gate polysilicon layer 42 is then planarized using a chemical mechanical polishing (CMP) process. In other embodiments, a different process may be used, such as for example, an etch-back with resist process. The gate polysilicon layer 42 will function as the select gate in the finished device.

Figure 11:
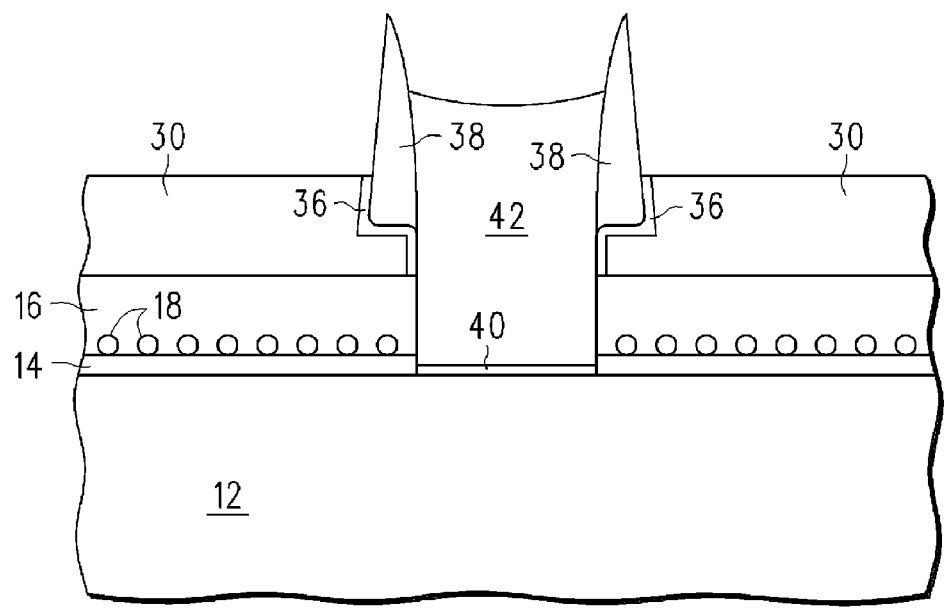

FIG. 11 illustrates a cross-sectional view of non-volatile memory device 10 after insulating layer 36 and oxide layer 32 are removed using a dry anisotropic etch process.

Figure 12:
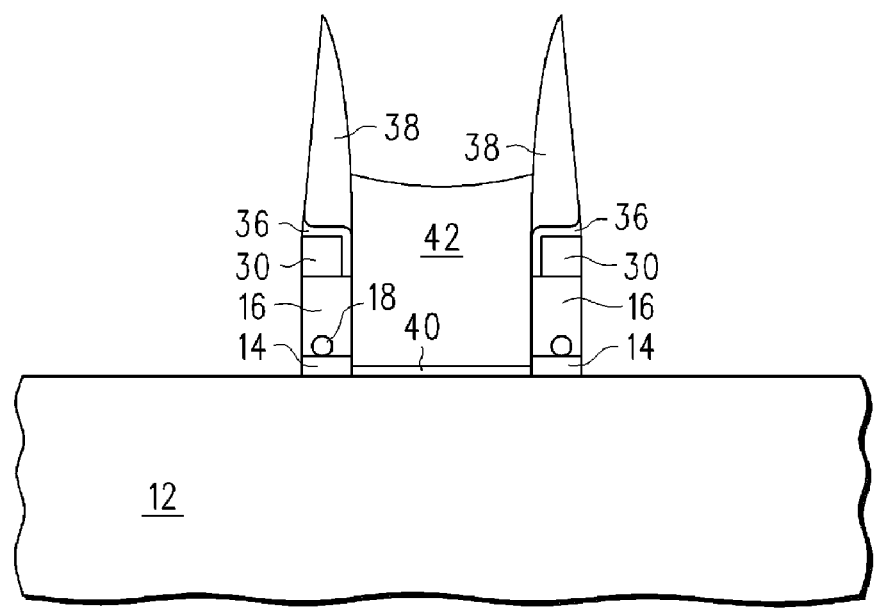

FIG. 12 illustrates a cross-sectional view of non-volatile memory device 10 after most of the reduced thickness polysilicon layer 30, layer 18, layer 16, and layer 14 are removed. The remaining portions of polysilicon layer 30 below each sidewall spacer 38 function as the control gates of the device 10. Nitride sidewall spacers 38 function as self-aligned masks preventing the removal of polysilicon layer 30, layer 18, layer 16, and layer 14 that lies directly beneath sidewall spacers 38. Also, there are remaining portions of insulating layer 36 between sidewall spacers 38 and polysilicon layer 30. As can be seen in FIG. 12, some of polysilicon layer 42 that lies between spacers 38 is removed as well.

Figure 13:
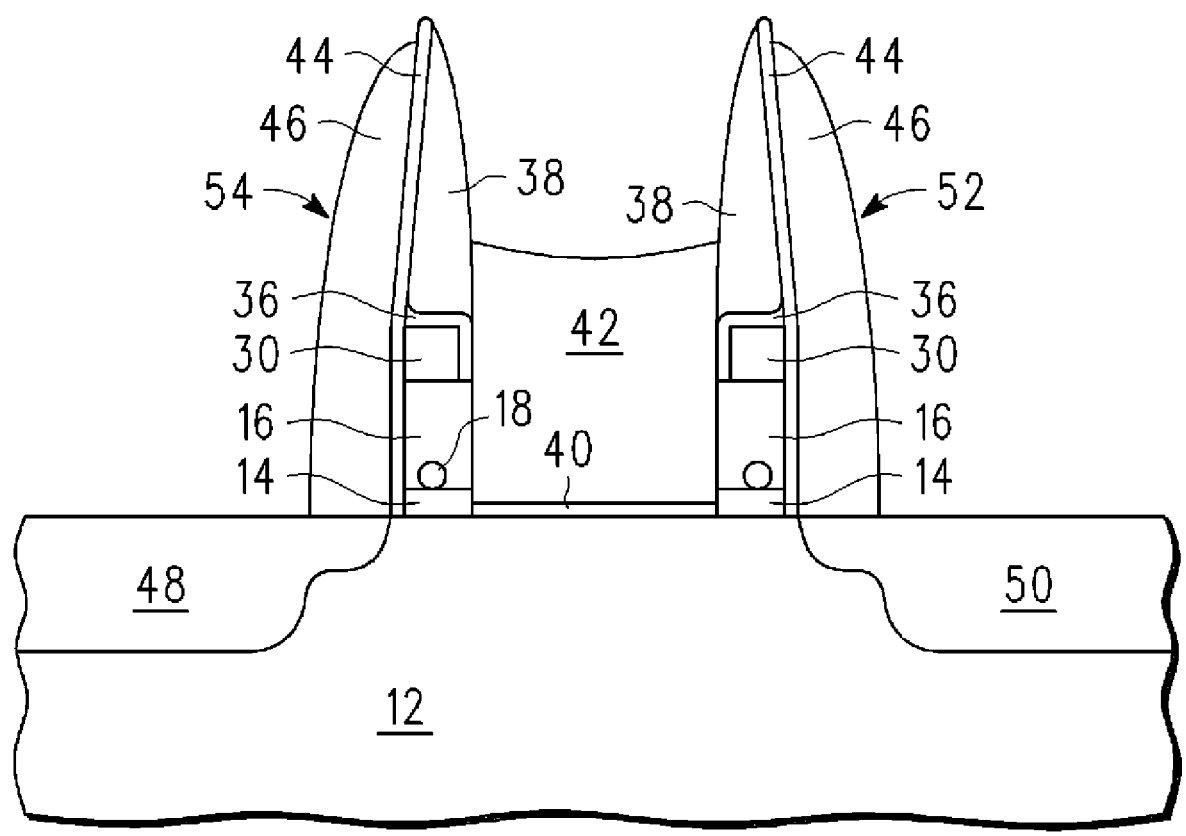

FIG. 13 illustrates a cross-sectional view of non-volatile memory device 10 after sidewall spacers 46 and source/drain regions 48 and 50 are formed. After forming sidewall spacers 46, drain/source regions 48 and 50 are diffused into substrate 10 and spaced laterally from the select gate 42. Note that drain/source regions 48 and 50 and sidewall spacers 46 are formed using conventional semiconductor processing techniques. Note also that drain/source regions 48 and 50 may include drain/source extensions under the sidewall spacers 46.

A non-volatile memory cell portion is formed beneath each of the sidewall spacers 38. Non-volatile memory cell portion 54 is beneath the left sidewall spacer 38 and includes a control gate formed from the remaining portion of polysilicon layer 30. Likewise non-volatile memory cell portion 52 is formed beneath the right sidewall spacer. A control gate is formed from the other remaining portion of polysilicon layer 30. The control gates are formed over charge storage portions formed from layer 16 and having nanocrystals 18. The polysilicon layer 42 between sidewall spacers 38 forms a select gate for the memory device 10.

The resulting multi-bit non-volatile memory device illustrated in FIG. 13 can separately store charge in portions 52 and 54 representing a logic state on either or both charge storage regions.

Because the charge storage regions are separated, the program and erase operations are simpler to control. Also, charge is prevented from migrating because the charge storage regions are separated. In addition, only one masking step is used, thus reducing manufacturing complexity and cost.

A device constructed according to the above disclosed embodiments of the present invention can be scaled, or reduced in size, because the charge storage regions are smaller than the minimum feature size of the integrated circuit. The size of the charge storage regions is determined by the side-wall spacers and the select gate portion between the charge storage regions that are formed from the fin or pillar shaped structure 21, and can therefore be smaller than the minimum feature size.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A method for forming a split-gate memory cell using a semiconductor substrate, comprising:
    forming a storage layer over the substrate;
    forming a first conductive layer over the storage layer;
    reducing a thickness of a portion of the conductive layer to leave a pillar of the conductive layer and an area of reduced thickness of the conductive layer;
    forming a first sidewall spacer adjacent to the pillar to cover a first portion and a second portion of the area of reduced thickness of the conductive layer;
    replacing the pillar with a select gate; and
    selectively removing the area of reduced thickness to leave the first and second portions as control gates.

2. The method of claim 1, wherein the step of replacing further comprises forming a gate dielectric under the select gate before formation of the select gate.

3. The method of claim 1, further comprising replacing the first sidewall spacer with a second sidewall spacer.

4. The method of claim 3 wherein the step of replacing the first sidewall spacer with a second sidewall spacer further comprises forming an insulating layer over the area of reduced thickness before forming the second sidewall spacer.

5. The method of claim 1, wherein the step of forming the first conductive layer is further characterized by the conductive layer comprising doped polysilicon.

6. The method of claim 5, wherein the step of forming the first sidewall spacer is further characterized by the first sidewall spacer comprising nitride.

7. The method of claim 1, further comprising forming source/drain regions in the substrate spaced laterally from the select gate.

8. The method of claim 7, wherein the step of forming a charge storage layer is further characterized by the charge storage layer comprising nanocrystals.

9. The method of claim 8, wherein the step of selectively removing is further characterized by an area in the charge storage layer directly under the first portion for defining a logic state of a first bit and an area in the charge storage layer directly under the second portion for defining a logic state of a second bit.

10. The method of claim 1, further comprising forming a nitride layer over the first conductive layer prior to the step of reducing the thickness.

11. A method for forming a split-gate memory cell using a semiconductor substrate, comprising:
    forming a storage layer over the substrate;
    forming a first polysilicon layer having a thickness over the storage layer;
    forming a nitride layer over the polysilicon layer;
    forming a masking layer having a pattern over the nitride layer;
    etching through the nitride layer according to the pattern;
    etching a portion of the polysilicon layer according to the pattern to leave a pillar of polysilicon under the masking layer and an area of reduced thickness of polysilicon surrounding the pillar;
    forming a first nitride sidewall spacer around the pillar to cover a portion of the area of reduced thickness and leaving an exposed portion of the area of reduced thickness;
    growing polysilicon over the exposed portion of the area of reduced thickness to form an area of enhanced thickness of polysilicon;
    oxidizing a top portion of the area of enhanced thickness of polysilicon to form a top oxide layer;
    removing the pillar to form an opening;
    replacing the first nitride sidewall spacer with a second nitride sidewall spacer;
    depositing a second polysilicon layer in the opening, over the second nitride sidewall spacer, and over the top oxide layer;
    etching back the second polysilicon layer to leave a polysilicon portion in the opening;
    removing the top oxide layer;
    while using the second nitride sidewall spacer as a mask, removing the area of enhanced thickness of polysilicon and the charge storage layer to leave a polysilicon remnant under the second sidewall spacer; and
    forming source/drains in the substrate spaced from the polysilicon portion in the opening.

12. The method of claim 11, wherein the step of forming the first polysilicon layer is further characterized by the first polysilicon layer being doped.

13. The method of claim 11, wherein the step of forming the storage layer over the substrate is further characterized by the charge storage layer comprising nanocrystals.

14. A method of claim 11, wherein the step of removing the area of enhanced thickness of polysilicon is further characterized by the remnant having a first portion as a first control gate and a second portion as a second control gate.

15. The method of claim 14, wherein the step of removing the area of enhanced thickness of polysilicon is further characterized by a first portion of the charge storage layer under the first control gate for defining a logic state of a first bit and a second portion of the charge storage layer under the second control gate for defining a logic of a second bit.

16. A method for forming a split-gate memory cell using a semiconductor substrate, comprising:
    forming a storage layer over the substrate;
    forming a first conductive layer over the storage layer;

reducing a thickness of a portion of the conductive layer to leave a pillar of the conductive layer and an area of reduced thickness of the conductive layer;

forming a first sidewall spacer adjacent to the pillar to cover a first portion and a second portion of the area of reduced thickness of the conductive layer;

forming an insulating layer over the area of reduced thickness;

while using the insulating layer as a mask, replacing the pillar with a select gate;

removing the insulating layer; and selectively removing the area of reduced thickness to leave the first and second portions as control gates.

17. The method of claim 16, wherein the step of forming an insulating layer over the area of reduced thickness comprises:

growing a polysilicon layer over the area of reduced thickness; and performing an oxidation step on the polysilicon layer.

18. The method of claim 17 further comprising:

forming a nitride layer over the conductive layer; and selectively etching the nitride layer to leave a portion of the nitride layer over the pillar prior to the step of reducing the thickness.

19. The method of claim 18, wherein the step of growing the polysilicon layer is further characterized as using the portion of the nitride layer as a mask.

20. The method of claim 16 wherein the step of forming the storage layer is further characterized as comprising nanocrystals, further comprising forming source/drains in the substrate laterally spaced from the select gate.

* * * * *